(12) United States Patent
Schmidhammer

(10) Patent No.: US 7,541,717 B2
(45) Date of Patent: Jun. 2, 2009

(54) BULK ACOUSTIC WAVE RESONATOR

(75) Inventor: Edgar Schmidhammer, Stein (DE)

(73) Assignee: EPCOS AG, Munich (DE)

( * ) Notice: Subject to any disclaimer, the term of this patent is extended or adjusted under 35 U.S.C. 154(b) by 48 days.

(21) Appl. No.: 11/868,006

(22) Filed: Oct. 5, 2007

(65) Prior Publication Data
US 2008/0084136 A1 Apr. 10, 2008

(30) Foreign Application Priority Data
Oct. 9, 2006 (DE) .............. 10 2006 047 698

(51) Int. Cl.
*H03H 9/02* (2006.01)
(52) U.S. Cl. .................... 310/320; 310/367
(58) Field of Classification Search ............ 310/320, 310/321, 367, 368
See application file for complete search history.

(56) References Cited

U.S. PATENT DOCUMENTS

| | | | |
|---|---|---|---|
| 3,356,850 A * | 12/1967 | Fleming-Williams | .... 250/214.1 |
| 4,320,365 A * | 3/1982 | Black et al. | ................. 333/187 |
| 4,463,336 A * | 7/1984 | Black et al. | ..................... 338/4 |
| 4,503,350 A * | 3/1985 | Nakatani | ..................... 310/321 |
| 4,511,202 A | 4/1985 | Kasai | |
| 5,736,911 A * | 4/1998 | Watanabe | .................... 333/188 |
| 6,087,762 A * | 7/2000 | Corbett et al. | .............. 310/330 |
| 6,518,688 B1 * | 2/2003 | Sasaki | ......................... 310/320 |
| 7,042,136 B2 * | 5/2006 | Kita et al. | .................... 310/320 |
| 7,310,861 B2 * | 12/2007 | Aigner et al. | ............. 29/25.35 |
| 2002/0121337 A1 * | 9/2002 | Whatmore et al. | ......... 156/285 |
| 2006/0119230 A1 * | 6/2006 | Umeda et al. | ............... 310/358 |
| 2006/0119453 A1 * | 6/2006 | Fattinger et al. | ............ 333/189 |
| 2006/0125084 A1 * | 6/2006 | Fazzio et al. | ................ 257/704 |
| 2006/0125577 A1 * | 6/2006 | Hsieh et al. | ................. 333/191 |
| 2006/0203421 A1 * | 9/2006 | Morris et al. | ............... 361/277 |

FOREIGN PATENT DOCUMENTS

| | | |
|---|---|---|
| EP | 1489740 | 12/2004 |
| WO | WO01/06647 | 1/2001 |

OTHER PUBLICATIONS

Hirama K et al., "Trapped-Energy AT-Cut Quartz Crystal Units with Grooves", IEEE International Frequency Control Symposium, Proceedings, May 28-30, 1997, pp. 750-757.

* cited by examiner

*Primary Examiner*—Thomas M Dougherty
(74) *Attorney, Agent, or Firm*—Fish & Richardson P.C.

(57) ABSTRACT

A bulk acoustic wave resonator includes a resonator region having electrodes and a piezoelectric layer among the electrodes. The piezoelectric layer has a groove that bounds at least part of an electroacoustically active region of the piezoelectric layer. A depth of the groove is at least 50% of a thickness of the piezoelectric layer.

16 Claims, 1 Drawing Sheet

BULK ACOUSTIC WAVE RESONATOR

CLAIM TO PRIORITY

This patent application claims priority to German Patent Application No. 102006047698.0, which was filed on Oct. 9, 2006. The contents of German Patent Application No. 102006047698.0 are hereby incorporated by reference into this patent application as if set forth herein in full.

BACKGROUND

PCT application no. WO01/06647A1 describes a bulk acoustic wave resonator.

SUMMARY

Described herein is a bulk acoustic wave resonator having a resonator region. When viewed in a direction perpendicular to a layer plane, the resonator region comprises two electrodes and a piezoelectric layer disposed between the electrodes. The piezoelectric layer includes a groove that bounds, and at least partially surrounds, an electroacoustically active region of the piezoelectric layer.

The piezoelectric layer may extend in a lateral plane beyond the surfaces of the electrodes. An active region, as used herein, includes a region of the piezoelectric layer that is disposed between the electrodes and in which an acoustic wave may be generated by an electrical signal.

The direction of polarization of the piezoelectric layer is characterized by an orientation of its piezoelectric axis. This piezoelectric axis may be oriented substantially vertically with respect to the layer plane. By slightly tilting the piezoelectric axis by even only a few degrees, it is possible to induce lateral modes (shear modes) in the piezoelectric layer. These modes propagate in a lateral plane and thus extend outwardly from the active resonator region, which can lead to losses of energy and to a higher signal attenuation in the resonator.

A wave mode generated in the active region is no longer able to propagate in the groove. A lateral wave mode, which impinges on an interface between the piezoelectric layer and the groove, will therefore be substantially back-reflected and thus remains within the active region.

The groove inhibits propagation of lateral wave modes to a relatively great extent. This results in a higher resonator quality. In addition, the groove makes it possible to acoustically isolate the resonator from adjacent resonators.

In a high frequency (HF) filter, which comprises resonators that operate with bulk acoustic waves, it is possible to reduce a ripple of the transfer function in the passband and to obtain particularly steep flanks along the edge of the passband. In particular, a near selection of the filter can be improved.

The groove may extend only to a certain depth in the piezoelectric layer. The depth of the groove may be least 50% of the thickness of the piezoelectric layer. Because of a lower material load, the critical frequency for an acoustic mode in a region of the piezoelectric layer that is below the groove may be higher than in the active region of the piezoelectric layer. As a result, a wave mode generated in the active region is unable to propagate underneath the groove and is attenuated.

In an embodiment, the groove cuts completely through the piezoelectric layer, with the depth of the groove being at least the thickness of the piezoelectric layer.

In an embodiment, the resonator comprises an acoustic mirror that is stationary, and connected to the resonator region. The acoustic mirror may be disposed between the resonator region and a carrier substrate.

The acoustic mirror may comprise at least two mirror layers, each having a different acoustic impedance. The or can also comprise more than two layers, in which case layers with a relatively high acoustic impedance and a relatively low acoustic impedance may be arranged in alternating sequence.

The thickness of the mirror layers may be substantially one quarter wavelength (or an integral multiple thereof) of a resonance frequency of the resonator.

In an embodiment, the groove can cut into, or through, the uppermost layer of the acoustic mirror. The groove may also cut through, in whole or part, at least two layers of the acoustic mirror.

The groove can be produced via etching. Either dry or wet etching method(s) can be used to produce the groove.

The groove can be produced using a laser. The shape of the groove, in particular the slope of its walls, depends on the method used to produce the groove. The groove can have a V-shaped cross section. A groove with relatively steep side walls may be useful. The groove can have a rectangular cross section or a cross section shaped as a trapezoid. The groove can have any width, depth and/or shape.

The piezoelectric layer may comprise AlN.

In an embodiment, the groove is at least partially filled with a filler material that is dielectric but not piezoelectric, thus ensuring that no acoustic wave can be generated in the area of the groove. The filler material may be elastic. This attenuates a reflected wave.

In another embodiment, the groove remains unfilled or is filled with air.

Within a region of the piezoelectric layer that is at least partially bounded by the groove, the angle of tilt of the piezoelectric axis may be no more than 2°. Outside the region of the piezoelectric layer bounded by the groove, the angle of tilt may be greater than 2°. The greater the angle of tilt in a specific region of the piezoelectric layer, the greater will be the generation of lateral acoustic modes in this region. The groove bounds an electroacoustically active region of the piezoelectric layer which, relative to the orientation of the piezoelectric axis, is relatively homogeneous from an outer region of this layer in which relatively strong lateral wave modes can be generated. Thus, in the electroacoustically active region of the piezoelectric layer, generation of interfering lateral wave modes is substantially suppressed.

The foregoing resonator is described in detail based on the accompanying FIGURE.

DETAILED DESCRIPTION

Figure 1:
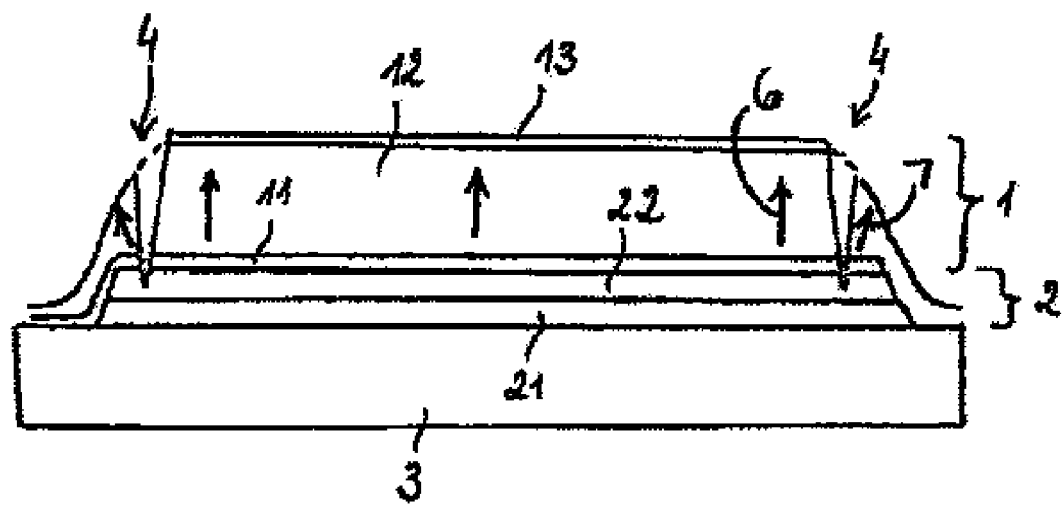
FIG. 1 shows a resonator that operates with bulk acoustic waves.

FIG. 1 shows a resonator containing resonator region 1, an acoustic mirror 2, and a carrier substrate 3. The resonator region 1 comprises electrodes 11, 13 and a piezoelectric layer 12 disposed between electrodes 11, 13. Piezoelectric layer 12 may be an AlN layer. The orientation of the piezoelectric axis of the piezoelectric layer 12 is indicated by arrows.

Acoustic mirror 2 is disposed between the resonator region 1 and the carrier substrate 3. The acoustic mirror comprises two mirror layers 21, 22. Each of the mirror layers 21, 22 has a different acoustic impedance.

In the example shown in the FIGURE, a V-shaped groove 4 cuts through the piezoelectric layer 12 and the lower electrode 11 and slightly into the uppermost mirror layer. This groove separates an active region of the piezoelectric layer, inside which the piezoelectric axis is substantially vertically oriented—e.g., 2° or less of tilt (as indicated by arrow 6), from an outer region of the piezoelectric layer in which the piezoelectric axis is more tilted (as indicated by arrow 7).

The groove may be located along the device periphery, e.g., it may enclose the electroacoustically active region in a frame-lie manner. The groove may also comprise a plurality of channels which are disposed around the active region with intermittent interruptions, one behind the other, along a direction of rotation.

The groove may isolate two resonators arranged side-by-side if the groove is in a region of the piezoelectric layer that is between the resonators.

The resonator described herein is not limited to the practical example shown in the FIGURE. The mirror may comprise any number of mirror layers. The carrier substrate and the electrodes can be made of any material and have any composition. The shape of the cross section of the groove can vary.

Elements of different embodiments may be combined to form embodiments not specifically described herein.

What is claimed is:

1. A bulk acoustic wave resonator comprising:
   a resonator region comprising electrodes and a piezoelectric layer among the electrodes;
   wherein the piezoelectric layer has a groove that bounds at least part of an electroacoustically active region of the piezoelectric layer; and
   wherein a depth of the groove is at least 50% of a thickness of the piezoelectric layer.

2. The bulk acoustic wave resonator of claim 1, further comprising:
   an acoustic mirror connected to the resonator region, the acoustic mirror comprising at least two layers, each of the at least two layers having a different acoustic impedance.

3. The bulk acoustic wave resonator of claim 2, wherein a depth of the groove corresponds to a thickness of the piezoelectric layer.

4. The bulk acoustic wave resonator of claim 2, wherein the acoustic mirror comprises an uppermost layer relative to a carrier substrate below the acoustic mirror; and
   wherein the groove cuts into at least the uppermost mirror layer.

5. The bulk acoustic wave resonator of claim 1, wherein the groove comprises an etched groove.

6. The bulk acoustic wave resonator of claim 1, wherein the groove has a substantially V-shaped cross section.

7. The bulk acoustic wave resonator of claim 1, wherein the piezoelectric layer comprises AlN.

8. The bulk acoustic wave resonator of claim 1, further comprising:
   an elastic material inside the groove.

9. The bulk acoustic wave resonator of claim 1, wherein an angle of tilt of a piezoelectric axis within a region of the piezoelectric layer at least partially bounded by the groove does not exceed 2°.

10. The bulk acoustic wave resonator of claim 2, wherein the groove comprises an etched groove.

11. The bulk acoustic wave resonator of claim 2, wherein the groove has a substantially V-shaped cross section.

12. The bulk acoustic wave resonator of claim 2, wherein the piezoelectric layer comprises AlN.

13. The bulk acoustic wave resonator of claim 2, further comprising:
   an elastic material inside the groove.

14. The bulk acoustic wave resonator of claim 2, wherein an angle of tilt of a piezoelectric axis within a region of the piezoelectric layer at least partially bounded by the groove does not exceed 2°.

15. The bulk acoustic wave resonator of claim 1, wherein the groove comprises a plurality of channels with intermittent interruptions that are disposed around the electroacoustically active region.

16. The bulk acoustic wave resonator of claim 1, wherein the groove separates the electroacoustically active region of the piezoelectric layer from an outer region of the piezoelectric layer, the electroacoustically active region having a piezoelectric axis that is substantially vertically oriented and the outer region having a piezoelectric axis is tilted.

* * * * *